United States Patent
Keum

(10) Patent No.: US 7,247,565 B2
(45) Date of Patent: Jul. 24, 2007

(54) METHODS FOR FABRICATING A COPPER INTERCONNECT

(75) Inventor: Dong Yeal Keum, Icheon-si (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 14 days.

(21) Appl. No.: 10/925,078

(22) Filed: Aug. 24, 2004

(65) Prior Publication Data

US 2005/0142874 A1    Jun. 30, 2005

(30) Foreign Application Priority Data

Dec. 31, 2003   (KR) ............... 10-2003-0101662

(51) Int. Cl.
*H01L 21/44* (2006.01)
(52) U.S. Cl. .................................... 438/687
(58) Field of Classification Search ............. 438/210, 438/687

See application file for complete search history.

(56) References Cited

U.S. PATENT DOCUMENTS

| | | | |
|---|---|---|---|
| 6,100,161 A | 8/2000 | Yu et al. | |
| 6,291,334 B1 | 9/2001 | Somekh | |
| 6,329,234 B1 * | 12/2001 | Ma et al. | 438/210 |

* cited by examiner

*Primary Examiner*—Carl Whitehead, Jr.
*Assistant Examiner*—Monica D. Harrison
(74) *Attorney, Agent, or Firm*—Saliwanchik, Lloyd & Saliwanchik

(57) ABSTRACT

Methods for fabricating a copper interconnect are disclosed. A disclosed method comprises: employing a damascene process to form a first trench in a first insulating layer; depositing a first barrier layer and a first copper layer on the first insulating layer; forming a bottom copper interconnect by planarizing the first copper layer; depositing and planarizing a second barrier layer; depositing a second insulating layer; forming a via hole in the second insulating layer; employing a damascene process to form a second trench in the second insulating layer; and forming a via and an upper copper interconnect by depositing a third barrier layer and a second copper layer on the second insulating layer.

7 Claims, 5 Drawing Sheets

METHODS FOR FABRICATING A COPPER INTERCONNECT

FIELD OF THE DISCLOSURE

The present disclosure relates generally to semiconductor fabrication, and, more particularly, to methods for fabricating a copper interconnect.

BACKGROUND

In recent years, the degree of integration in semiconductor devices has advanced. Copper is sometimes used in semiconductor devices as an interconnect material instead of tungsten or an aluminum alloy. Copper has high reliability and low specific resistance. In comparison to pure copper interconnects, copper alloy interconnects have excellent reliability and corrosion resistance, in spite of their relatively high resistivity. However, copper is used instead of tungsten and aluminum alloys because Tungsten and aluminum alloys exhibit high resistivity and low reliability due to EM (Electro Migration) and SM (Stress Migration).

EM is a glitch caused by an increase of current density in metal interconnects. The increase in current density results from high speed operations and the miniaturized width of the interconnects.

SM is a creep facture mode caused by mechanical stress on an interconnect. The difference in the thermal expansion factors between a metal interconnect and an insulating layer covering the metal interconnect for protection is typically the cause of this mechanical stress.

The dual damascene process for inlaying metals on the interconnect line is prevalently performed in later stages. This process was developed to overcome the inefficiency of a copper etching process. In solving problems arising from the different structure and the complete change of equipment, the copper dual damascene process has been proven to be cost-effective and process friendly.

FIG. 1a through FIG. 1d are cross-sectional views which schematically illustrate a prior art method of fabricating a copper interconnect.

Referring to FIG. 1a, an insulating layer 10 is deposited on a substrate (not shown) including predetermined devices. A trench and a via opening are formed on the insulating layer 10 through a dual damascene process. A barrier layer 11 is then deposited over the trench and the via opening. The trench and the via opening are then filled with copper 12 through an ECP (Electro Chemical Plating) process and a CMP (Chemical Mechanical Polishing) process to form the bottom copper interconnect.

Referring to FIG. 1b, a capping layer 13 is made on the copper interconnect by depositing a SiN layer with a thickness of about 700 Å over the substrate and the bottom copper interconnect.

Referring to FIG. 1c, an interlayer insulating layer 14 is deposited on top of the capping layer 13 to insulate the copper interconnect.

Referring to FIG. 1d, a via hole 15 is made by etching the interlayer insulating layer 14 with a photoresist mask. The via hole 15 is then filled with a conducting material, thereby forming a via (i.e., a plug or interlayer connector) which connects the bottom interconnect with an upper interconnect.

The above-mentioned methods for fabricating a copper interconnect have several problems.

First, once oxidized regions are formed on the surface of copper, a gap may be generated between the SiN layer and the surface of the copper due to poor adhesion. A short between interconnects may occur due to copper diffusion into the gap.

Second, when the via is formed to connect an upper interconnect with a bottom interconnect, if the capping layer is not properly opened, a connection may not be formed between the upper interconnect and the bottom interconnect.

Finally, the high dielectric constant of the SiN layer may cause an increase of the overall dielectric constant between the bottom interconnect and the upper interconnect.

Somekh, U.S. Pat. No. 6,291,334 describes a method of forming an etching stop layer for a dual damascene process.

Yu et al., U.S. Pat. No. 6,100,161, describe a method of fabricating a raised source/drain transistor.

DETAILED DESCRIPTION

Figure 1A:
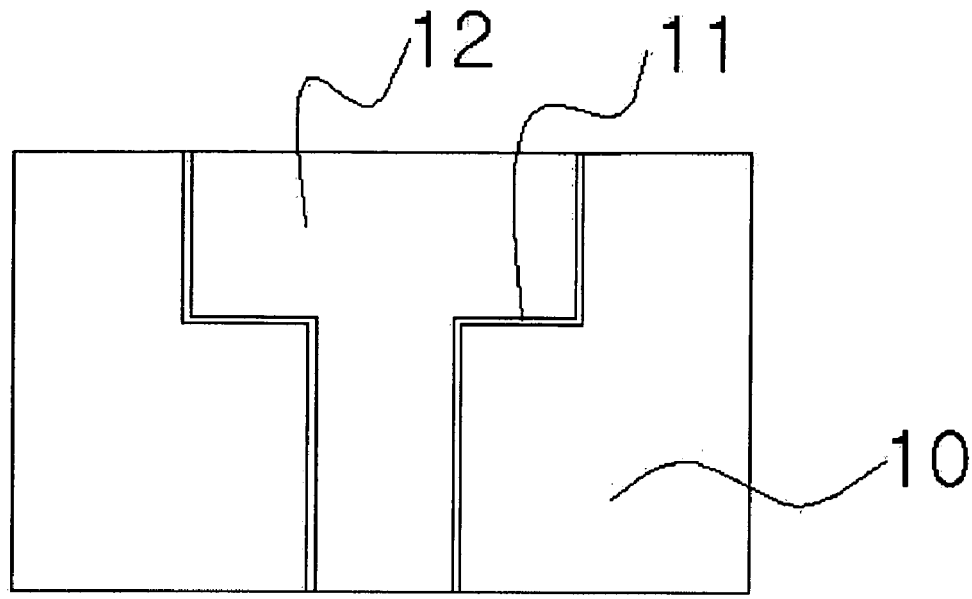
FIGS. 1a through 1d are cross-sectional views that illustrate a prior art process for fabricating a copper interconnect.
Figure 1B:
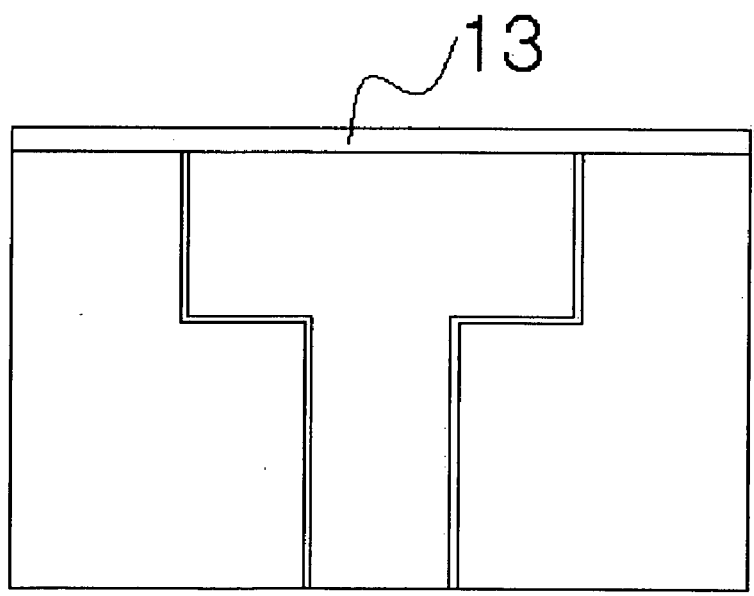
Figure 1C:
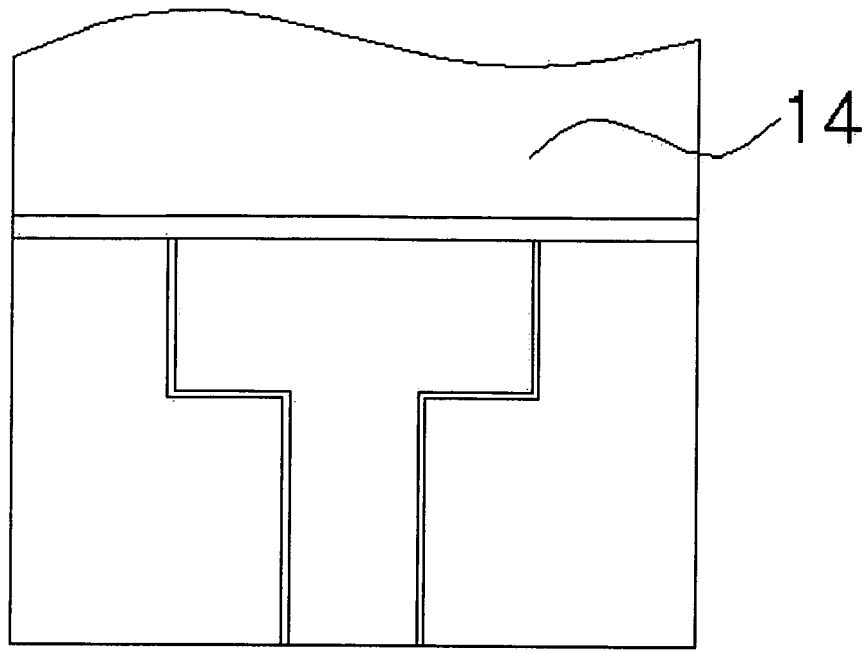
Figure 1D:
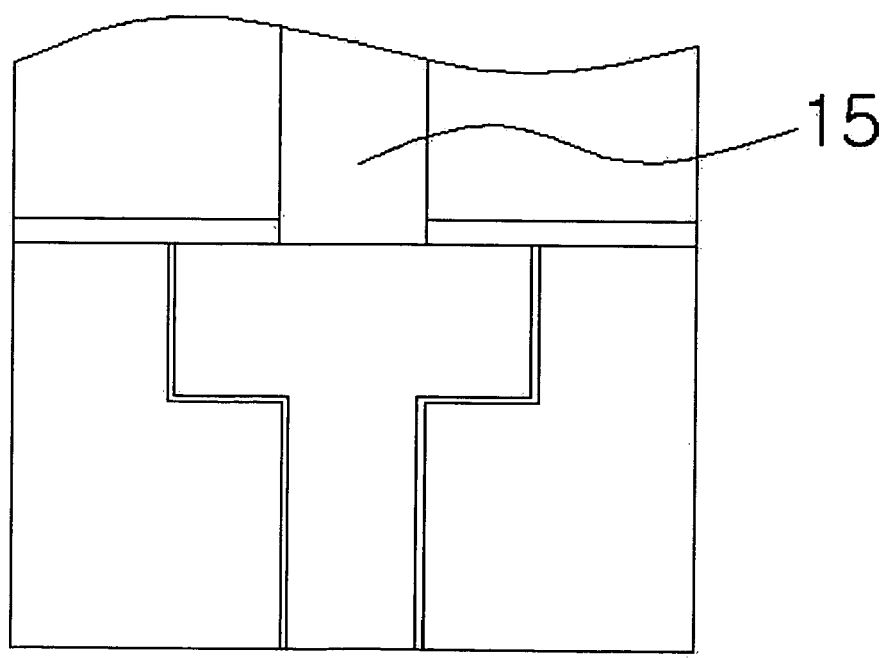
Figure 2A:
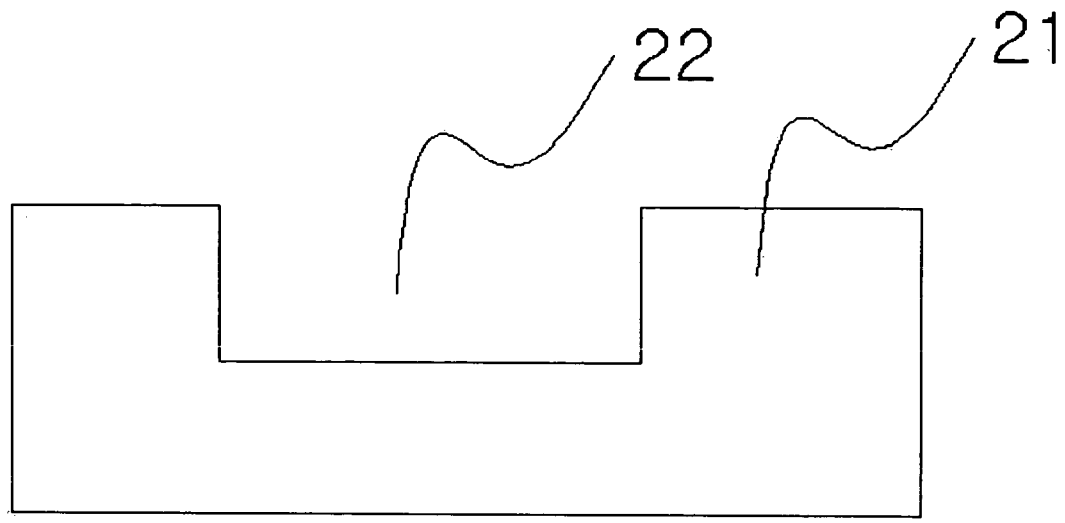
FIGS. 2a through 2e are cross-sectional views that illustrate an example process for fabricating a copper interconnect in accordance with the teachings of the present invention.

FIGS. 2a through 2e are cross-sectional views illustrating an example process of fabricating a copper interconnect. Referring to FIG. 2a, a first insulating layer 21 is deposited on a substrate (not shown) including at least one passive or active device (e.g., a resistor, a capacitor, an inductor, a transistor, etc.). A first trench 22 is then formed in the first insulating layer 21 through a damascene process in order to create a bottom interconnect. It is preferred to use silicon oxide as the material of the first insulating layer.

Figure 2B:
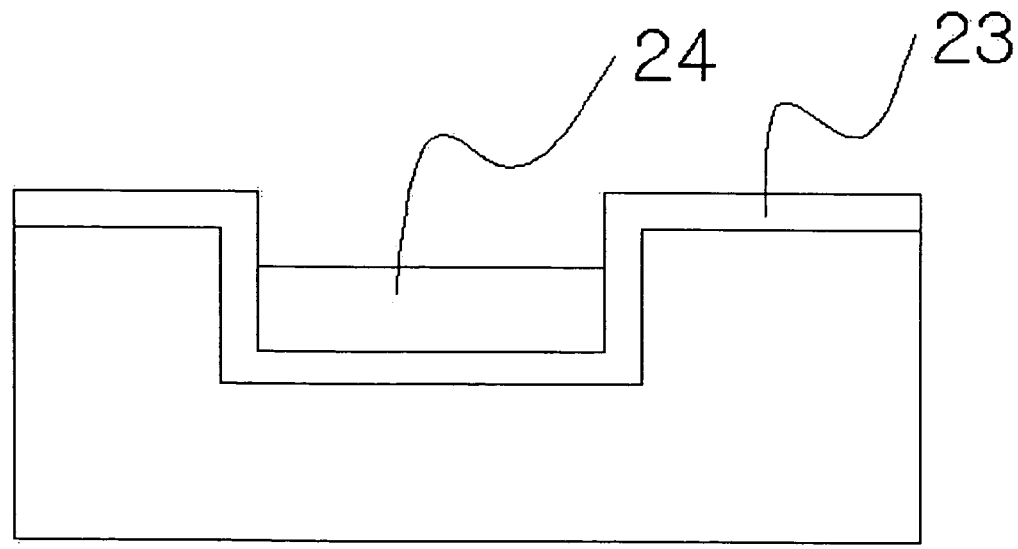

Referring to FIG. 2b, a first barrier layer 23 and a first copper layer 24 are deposited sequentially on the first insulating layer 21 (including the trench 22) to form a bottom interconnect. The first barrier layer 23 is preferably made of Ta/TaN. The deposition of the copper 24 is achieved by PVD (Physical Vapor Deposition), CVD (Chemical Vapor Deposition) or EPC (Electro Chemical Plating). The deposited copper 24 is selectively planarized and dished to a thickness of about 200 Å to 300 Å. It is noted that the first barrier layer 23 should not be planarized.

Figure 2C:
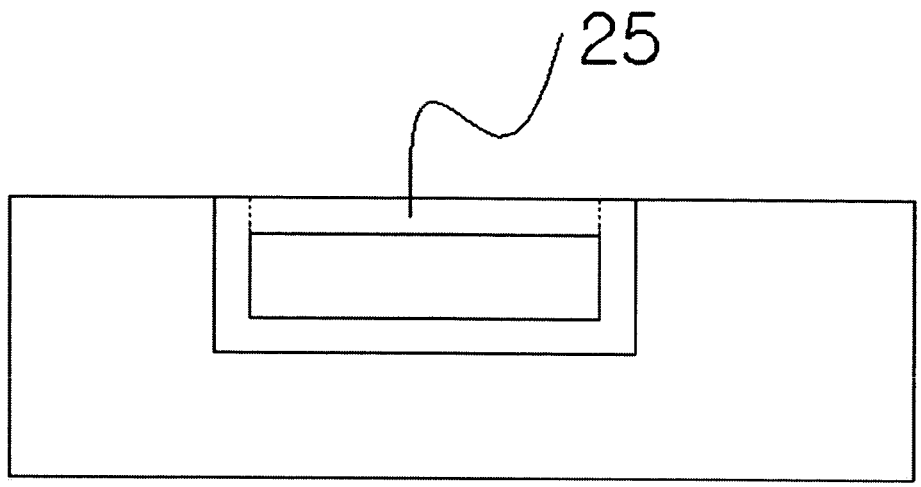

Referring to FIG. 2c, a second barrier layer 25 is deposited over the structure. Both the first and the second barrier layers 23, 25 are then planarized so that both the first and the second barrier layers 23, 25 remain only in the region of the bottom interconnect, not on the first insulating layer 21. In other words, the side and the bottom of the interconnect are protected with the first barrier layer 23, and the top of the interconnect is covered with the second barrier layer 25. In the planarization process, it is proper that the first and the second barrier layers 23, 25 and the first insulating layer 21 should be etched with the same etching ratio. The second barrier layer 25 is preferably made of Ta/TaN.

Figure 2D:
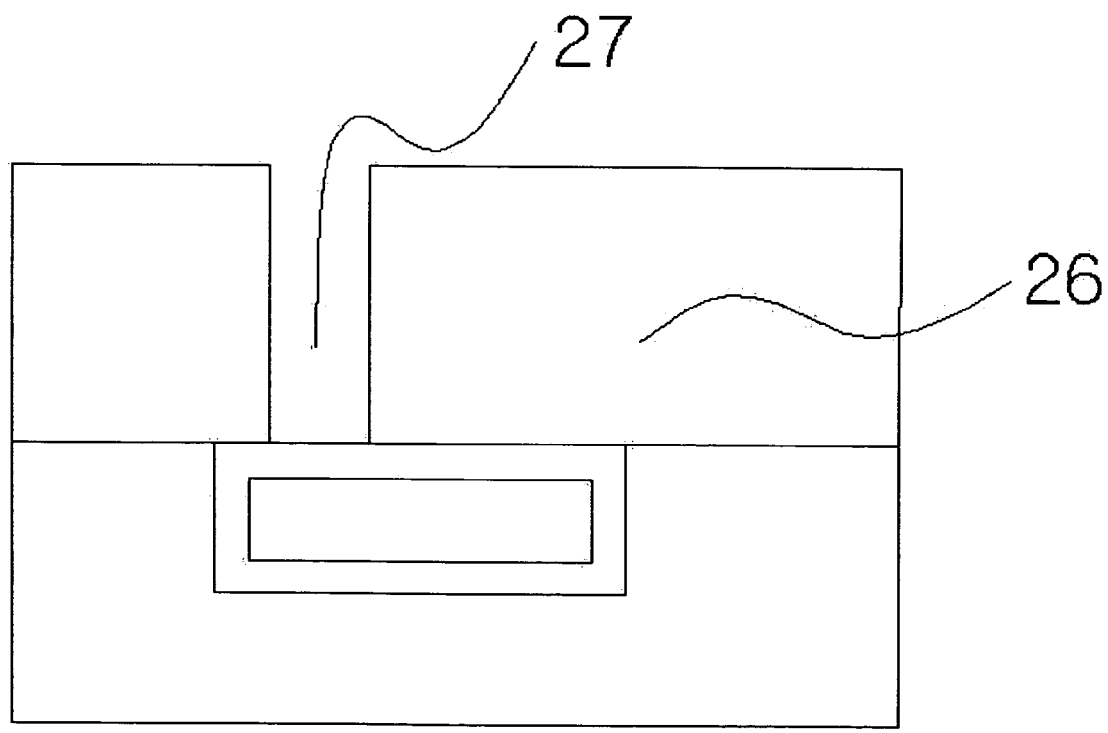

Referring to FIG. 2d, a second insulating layer 26 is deposited over the bottom copper interconnect. A via hole 27 for connection with the upper interconnect is then formed by etching the second insulating layer 26. The second insulating layer 26 is preferably made of silicon oxide. The silicon oxide of the first and the second insulating layers 21, 26 is most preferably comprised of FSG (Fluorinated Silica Glass).

Figure 2E:
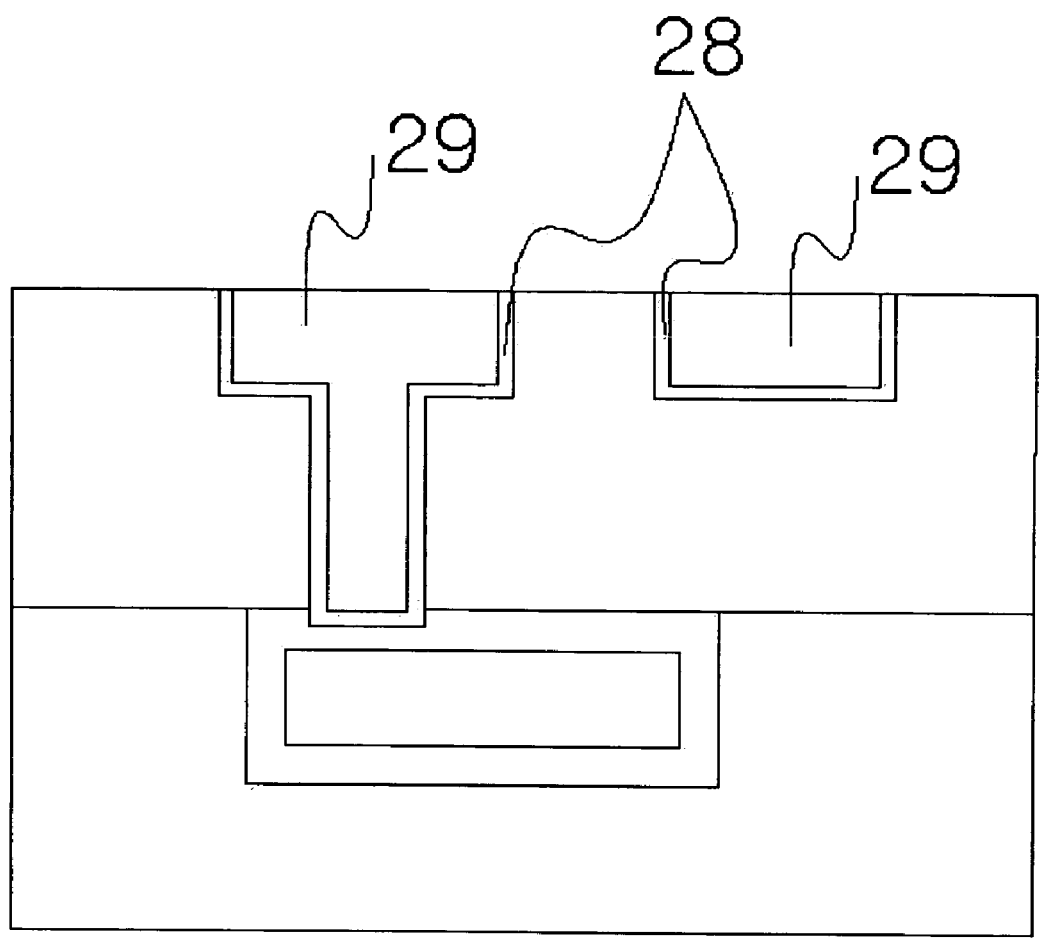

Referring to FIG. 2e, a photoresist layer is formed on the structure (including the via hole 27), and then etched until the surface of the second insulating layer 26 is exposed. As a result, the photoresist layer remains only in the via hole 27. A damascene process is then performed so that a photoresist layer is again deposited and patterned, and the second insulating layer 26 is etched to form a second trench for the upper interconnect. A third barrier layer 28 and a second copper layer 29 are then deposited over the structure (including the via hole 27 and the trench), and then planarized to form an upper copper interconnect as shown in FIG. 2e. The third barrier layer is preferably made of Ta/TaN.

From the foregoing, persons of ordinary skill in the art will appreciate that methods for fabricating copper interconnects have been disclosed. A disclosed method for fabricating a copper interconnect employs Ta/TaN, instead of $SiN_3$, as barrier layers in order to achieve a low dielectric constant in the copper interconnect, and to prevent the diffusion of copper and the penetration of impurities.

A disclosed method for fabricating a copper interconnect comprises: forming a first trench in a first insulating layer having at least one active or passive electrical device through a damascene process; depositing a first barrier layer and a first copper layer on the structure; forming a bottom copper interconnect by planarizing and dishing the first copper layer; depositing and planarizing a second barrier layer over the structure; forming a via hole by depositing and patterning a second insulating layer over the structure; forming a second trench by etching the second insulating layer through a damascene process; and forming a via and an upper copper interconnect by depositing a third barrier layer and a second copper layer on the second insulating layer.

This patent claims priority from Korean patent application serial number 10-2003-0101662, which was filed on Dec. 31, 2003, and which is hereby incorporated by reference in its entirety.

Although certain example methods, articles of manufacture and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a copper interconnect comprising:
    employing a damascene process to form a first trench in a first insulating layer;
    depositing a first barrier layer in the first trench;
    depositing a first copper layer on the first barrier layer;
    depositing a second barrier layer on the first copper layer;
    depositing a second insulating layer on the first insulating layer and the second barrier layer;
    forming a via hole in the second insulating layer;
    employing a damascene process to form a second trench in the second insulating layer; and
    forming a via and an upper copper interconnect by depositing a third barrier layer and a second copper layer on the second insulating layer.

2. A method as defined in claim 1, wherein the first, the second and the third barrier layers are made of Ta/TaN.

3. A method as defined in claim 1, wherein the first and the second insulating layers are made of silicon oxide.

4. A method as defined in claim 1, wherein the first copper layer has a thickness between about 200 Å and about 300 Å.

5. A method as defined in claim 1, further comprising:
    planarizing the first copper layer, wherein planarizing the first copper layer forms a bottom copper interconnect; and
    planarizing the first and second barrier layers, wherein planarizing the first and second barrier layers removes the first and second barrier layers from the top of the first insulating layer.

6. A method as defined in claim 5, wherein planarizing the first copper layer comprises dishing the first copper layer.

7. A method as defined in claim 1, wherein a bottom portion of the third barrier layer is formed in the second barrier layer.

* * * * *